(12) United States Patent
Muchherla et al.

(10) Patent No.: US 11,748,013 B2
(45) Date of Patent: *Sep. 5, 2023

(54) GROUPING BLOCKS BASED ON POWER CYCLE AND POWER ON TIME

(71) Applicant: Micron Technology, Inc., Boise, ID (US)

(72) Inventors: Kishore Kumar Muchherla, San Jose, CA (US); Mustafa N. Kaynak, San Diego, CA (US); Jiangang Wu, Milpitas, CA (US); Sampath K. Ratnam, San Jose, CA (US); Sivagnanam Parthasarathy, Carlsbad, CA (US); Peter Feeley, Boise, ID (US); Karl D. Schuh, Santa Cruz, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/949,977

(22) Filed: Sep. 21, 2022

(65) Prior Publication Data

US 2023/0017591 A1 Jan. 19, 2023

Related U.S. Application Data

(63) Continuation of application No. 17/153,233, filed on Jan. 20, 2021, now Pat. No. 11,500,564.

(51) Int. Cl.
G06F 3/06 (2006.01)
G11C 16/10 (2006.01)
G11C 16/04 (2006.01)

(52) U.S. Cl.
CPC ............ *G06F 3/064* (2013.01); *G06F 3/0625* (2013.01); *G06F 3/0659* (2013.01); *G06F 3/0673* (2013.01); *G11C 16/10* (2013.01); *G11C 16/0483* (2013.01)

(58) Field of Classification Search
CPC ...... G06F 3/0625; G06F 3/064; G06F 3/0659; G06F 3/0673; G11C 16/0483; G11C 16/10

See application file for complete search history.

(56) References Cited

U.S. PATENT DOCUMENTS

| | | |
|---|---|---|
| 7,188,225 B1 | 3/2007 | Therene et al. |
| 2012/0284453 A1 | 11/2012 | Hashimoto |
| 2016/0041891 A1* | 2/2016 | Malshe ............... G06F 11/1048 714/704 |
| 2020/0105353 A1 | 4/2020 | Sharon et al. |

* cited by examiner

*Primary Examiner* — Larry T Mackall
(74) *Attorney, Agent, or Firm* — LOWENSTEIN SANDLER LLP

(57) ABSTRACT

An initial value of a power cycle count associated with the memory device is identified. The power cycle count is incremented responsive to detecting a powering up of the memory device. Responsive to programming a block residing in the memory device, the block is associated with a current block family associated with the memory device. A currently value of the power cycle count is determined. Responsive to determining that a difference between the initial value of the power cycle count and the current value of the power cycle count satisfies a predefined condition, the current block family is closed.

20 Claims, 11 Drawing Sheets

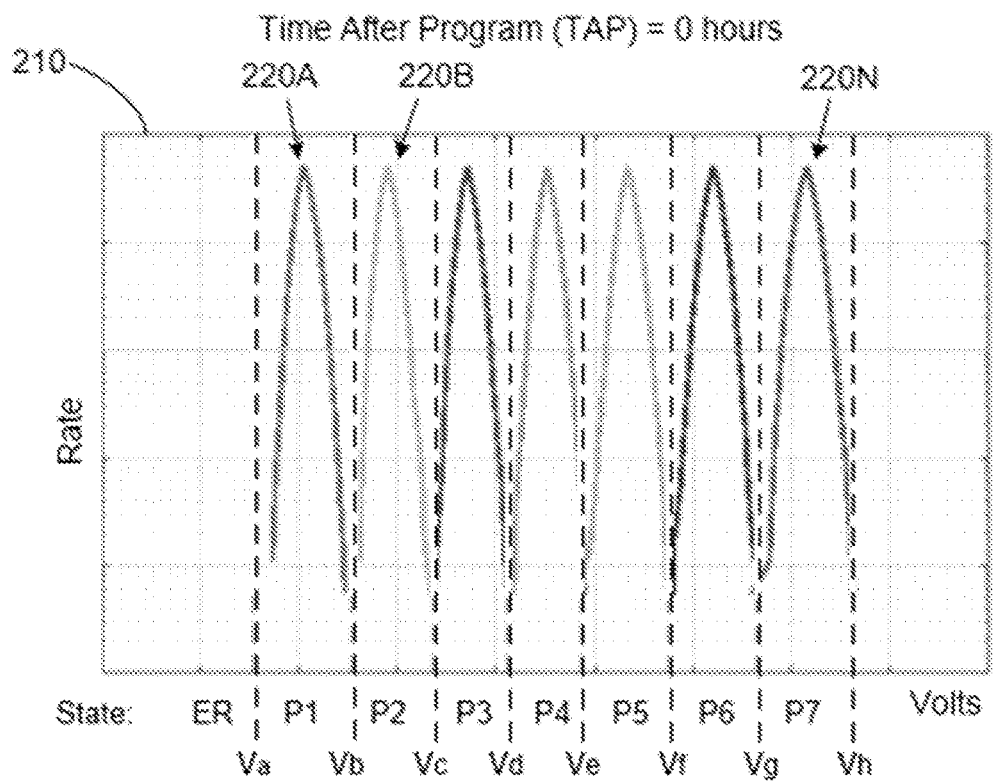
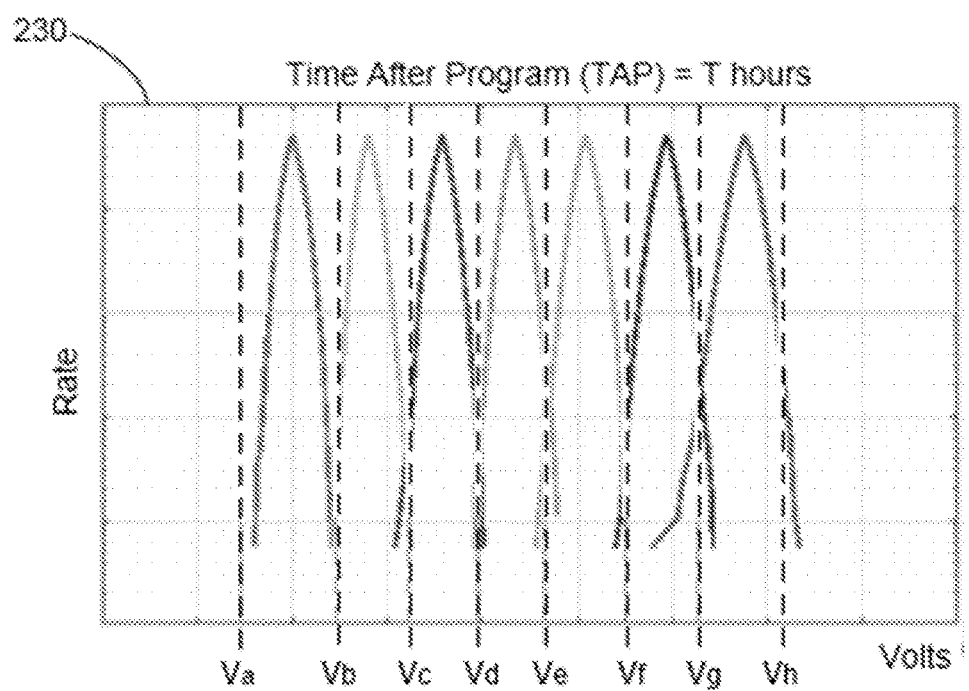
FIG. 2

1000

```
┌─────────────────────────────────────────────────────────────┐
│ Identify a plurality of blocks of the memory device that share a │
│ common power cycle interval, a common programming time      │
│          interval, and a common temperature range           │
│                           1010                              │
└─────────────────────────────────────────────────────────────┘
                              │
                              ▼
┌─────────────────────────────────────────────────────────────┐
│      Perform a scan operation with respect to a subset of the│
│                      plurality of blocks                    │
│                           1020                              │
└─────────────────────────────────────────────────────────────┘
                              │
                              ▼
┌─────────────────────────────────────────────────────────────┐
│   Associate, based on the scan operation, the plurality of blocks│
│                         with a bin                          │
│                           1030                              │
└─────────────────────────────────────────────────────────────┘
                              │
                              ▼
┌─────────────────────────────────────────────────────────────┐
│     Update block family metadata associated with the memory │
│                            device                           │
│                           1040                              │
└─────────────────────────────────────────────────────────────┘
```

FIG. 10

GROUPING BLOCKS BASED ON POWER CYCLE AND POWER ON TIME

RELATED APPLICATIONS

The present application is a continuation of U.S. patent application Ser. No. 17/153,233, filed Jan. 20, 2021, which is incorporated by reference herein.

TECHNICAL FIELD

Embodiments of the disclosure relate generally to memory sub-systems, and more specifically, relate to grouping blocks based on power cycle and power on time.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 schematically illustrates the temporal voltage shift caused by the slow charge loss exhibited by triple-level memory cells, in accordance with some embodiments of the present disclosure.

FIG. 10 is a flow diagram to associate block families with a particular threshold voltage offset bin based on a calibration scan, in accordance with some embodiments of the present disclosure.

DETAILED DESCRIPTION

Figure 1:
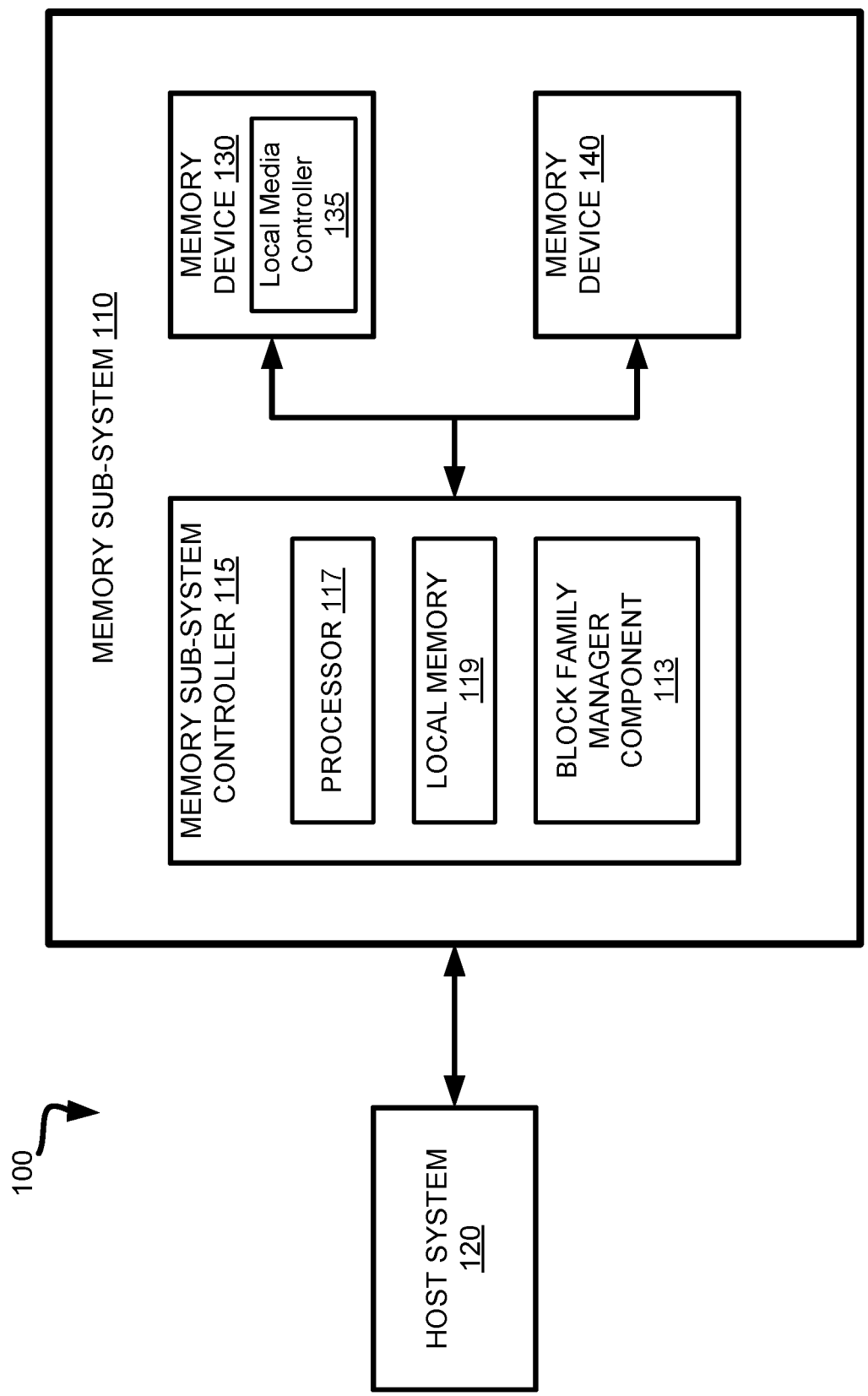
FIG. 1 illustrates an example computing system that includes a memory sub-system in accordance with some embodiments of the present disclosure.

Aspects of the present disclosure are directed to grouping block based on power cycle and power on time. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error correction code (ECC) codeword, parity code), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell which is called as the "threshold voltage" and denoted as $V_T$.

A high-quality memory device can have distributions that are narrow compared with the working range of control voltages tolerated by the cells of the device. Accordingly, multiple distributions (with "valleys" between distributions)

can be fit into the working voltage window allowing storing and reliably detecting multiple bits per cell such as $2^3=8$ distributions (7 valleys) for triple level cells (TLC), $2^2=4$ distributions (3 valleys) for multi-level cells (MLC), etc. The distributions are interspersed with voltage intervals ("valley margins") between distributions where none (or very few) of the memory cells of the device have their threshold voltages. Such valley margins can, therefore, be used to separate various charge states—the logical state of the cell can be determined by detecting during a read operation by applying read voltages corresponding to each valley. This effectively allows a single memory cell to store multiple bits of information: a memory cell operated with $2^N$ distributions (which are also called levels) is capable of storing N bits of information. During the read operation, $2^N-1$ read voltages are applied to distinguish $2^N$ distributions. Specifically, the read operation can be performed by comparing the measured threshold voltage $V_T$ exhibited by the memory cell to one or more reference read voltage levels corresponding to known valleys (e.g., centers of the valleys) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). TVS can include different components such as intrinsic charge loss, system charge loss, quick charge loss, etc. TVS generally increases with increasing number of by Program Erase Cycles (PEC), higher temperatures, and higher program voltages. TVS can show significant die-to-die variation.

Since typical cells store negatively charged particles (electrons), the loss of electrons causes the threshold voltages to shift along the voltage axis towards lower threshold voltages $V_T$. The threshold voltages can change rapidly at first (immediately after the memory cell is programmed) while slowing down at larger times in an approximately log-linear or power-law fashion ($\Delta V_T(t)=-C*t^b$) with respect to the time t elapsed since the cell programming event, referred herein as Time After Program (TAP). TAP can be estimated (e.g., inferred from a data state metric), or directly measured (e.g., from a controller clock). A cell, block, page, block family (groups of blocks), etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice may be referenced by its center point (e.g., 10 minutes). In some embodiments of the present disclosure, TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ (displayed by the cell immediately after programing) is modified by the voltage offset: $V_T \rightarrow V_T+\Delta V_T$ where $\Delta V_T$ is negative due to charge loss. Whereas TVS is a continuous process and the compensating for $\Delta V_T(t)$ can be a continuous function of time, adequate accuracy of offsets can be achieved in some embodiments with a discrete number of threshold voltage offset "bins." "Families" of blocks (or any other memory partitions) programmed within a specified time window and/or under similar environmental (e.g., temperature) conditions can be associated with one of the threshold voltage offset bins. Given that wear-leveling keeps programmed at similar program-erase cycles (PECs), the time elapsed since programming and temperature conditions are among the main factors affecting the amount of TVS, different partitions within a single block family can be presumed to exhibit similar distributions of threshold voltages of their memory cells, and thus would require the same voltage offsets to be applied to the base read levels for read operations.

Block families can be created asynchronously with respect to block programming events. In an illustrative example, a new family can be created ("opened") whenever a specified period of time $\Delta t$ (e.g., a predetermined number of minutes) has elapsed since the creation of the last block family or whenever the reference temperature of memory cells has changed by more than a specified threshold temperature $\Delta\Theta$ (e.g. 10C, 20C, or any other value). Similarly, the family can be "closed" (and a new family can be created) after the time $\Delta t$ has elapsed since the family was created or if the reference temperature has changed (in either direction) by more than $\Delta\Theta$. A memory sub-system controller can maintain an identifier of the active block family, which is associated with one or more blocks as they are being programmed.

The memory sub-system controller can periodically perform a calibration process in order to associate partitions of various families with one of the threshold voltage offset bins. Each threshold voltage offset bin, in turn, can be associated with a set of the voltage offsets to be applied for read operations. The associations of partitions with families and families with threshold voltage offset bins is referred herein as auxiliary read metadata (ARM), which represent a part of broader state metrics of the memory device. The state metrics can also include the number of retired physical memory blocks (or other partitions), the number of times various physical blocks have been erased, types of configurations of cells of various memory partitions (e.g., single-level cell vs. multi-level cells), or any other type of information representative of the state of the memory device. The ARM can be stored in metadata tables maintained by the memory sub-system controller.

The calibration scan (also called calibration process) can evaluate a data state metric (e.g., a voltage shift or bit error rate) for each die of each block family with one of a set of predefined threshold voltage offset bins, e.g., by, for each die of each block family, measuring a value of data state metric of a block (of the block family) stored on the die. The calibration scan can then update a bin pointer associated with the die and block family to point to a threshold voltage offset bin that corresponds to the measured value of the data state metric. Each threshold voltage offset bin is in turn associated with a voltage offset to be applied for read operations. For example, a TLC has 8 distributions (levels) and 7 valleys. So for a given threshold voltage offset bin associated with a TLC, there are 7 offsets (i.e., one offset for each valley). The bin pointer, for example, can remain the same if the data state metric is in a range associated with the existing bin pointer, or can be changed to point to an older threshold voltage offset bin if the data state metric is in a range associated with the older threshold voltage offset bin. Although a block family can be associated (by bin pointers) with multiple different threshold voltage offset bins, a block family is herein referred to as being associated with ("in") a particular one of the threshold voltage offset bins. More particularly, a block family is associated with (or in) the oldest threshold voltage offset bin with which a die of the block family is associated.

In accordance with embodiments of the present disclosure, the TVS can be selectively tracked for programmed partitions that are grouped into families. Based on the groupings of partitions into families, appropriate bin-specific read (voltage) offsets are applied to the base read (voltage) levels in read operations. Base read levels can also be stored in the metadata of the memory device. Upon receiving a read command, the memory sub-system controller can identify the family associated with the memory partition identified by the logical address specified in the read command, identify the current threshold voltage offset bin associated with the identified family, determine a set of read offsets for the identified threshold voltage offset bin, compute the new read voltages by additively applying the read offsets associated with the identified threshold voltage offset bin to the base read levels, and perform the read operation using the new read voltage, as described in more detail below.

Power events, such as power surges, powering down (graceful or asynchronous) and subsequent powering up of the memory sub-system can significantly disrupt the TVS dynamics. As a result, associations of memory partitions with specific threshold voltage offset bins, as determined prior to the power event and stored in the metadata tables, may no longer adequately identify read voltage offsets (as specified by the respective threshold voltage offset bins) for reliable post-event read operations.

In some implementations, the memory sub-system controller can group blocks into block families based on their respective timestamps, which are recorded using a cumulative power-on clock, which tracks the power on time of the memory sub-system and is paused when the memory sub-system is powered off. However, since the cumulative power-on clock does not track the power off time of the memory sub-system, two blocks that appear to have been programmed within a short period of time based on the cumulative power-on timestamp may be grouped in a common block family, while in fact a significant period of time (e.g., hours or days) had elapsed between programming the blocks while memory sub-system was powered off.

Aspects and embodiments of the present disclosure address the above-referenced and other deficiencies by implementing a memory sub-system controller that groups blocks (or other memory partitions) based on a combination of the power cycle count and the power on time of the memory sub-system. The power cycle count maintained by the memory sub-system controller is incremented upon detecting a power on event. Thus, upon detecting an increment of the power cycle count, the memory sub-system controller closes the current block family and initializes a new block family for newly programmed blocks.

In some embodiments, the memory sub-system can selectively scan memory device blocks based on their respective programming times and power cycle counts. In some implementations, the memory sub-system controller can identify a subset of blocks that share the same programming time interval and the same power cycle count. The memory sub-system controller can associate the identified subset of blocks with a threshold voltage offset bin determined based on one or more scan operations performed with respect to one or more blocks of the subset.

Advantages of the present disclosure include, but are not limited to, improving performance of memory sub-systems by grouping blocks based on power cycle as well as power on time, thus reducing the rate of errors in read operations of blocks that were programmed within a timeframe that includes power-off time. Furthermore, by performing scans in response to a power event, the memory sub-system can avoid performing scans during performance benchmarks, as perform benchmarks typically are completed within the same power cycle. Hence, aspects of the present disclosure reduce or eliminate scans performed during performance benchmarks.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAIVI), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a block family manager component 113 that can group blocks based on a power cycle count and a cumulative power-on timestamp. In some embodiments, the memory sub-system controller 115 includes at least a portion of the block family manager component 113. In some embodiments, the block family manager component 113 is part of the host system 110, an application, or an operating system. In other embodiments, local media controller 135 includes at least a portion of the block family manager component 113 and is configured to perform the functionality described herein.

The block family manager component 113 can determine a power cycle count as well as a cumulative power-on time period when grouping blocks in a block family. The memory sub-system controller 115 can maintain a cumulative power-on clock that can be stored in non-volatile memory device 140. The cumulative power-on clock tracks the power on time of the memory sub-system, and saves the clock setting when the memory sub-system is powered off. When the memory sub-system is powered on, the cumulative power-on clock resumes from the saved clock setting. For example, if the memory sub-system is powered off at 2:45 pm, the memory sub-system controller 115 saves the cumulative power-on clock setting to memory device 140 (e.g., the cumulative power-on clock setting can store a cumulative power-on time of 240 minutes). When the memory sub-system is subsequently powered on at, for example, 7:50 pm that same day, the cumulative power-on clock will resume at the saved setting (240 minutes in this example). Based on the cumulative power-on clock, blocks programmed at 7:51 pm appear to have been programmed within 2 minutes of blocks programmed at 2:44 pm. However, the blocks were actually programmed more than 5 hours apart.

Hence, the block family manager component 113 can also consider the power cycle count when grouping blocks. The memory sub-system controller 115 can store a power cycle count, for example in non-volatile memory device 140. The power cycle count is incremented upon detecting a power on event of the memory sub-system.

The block family manager component 113 can initialize a block family associated with a memory device, such as memory device 140. The block family manager component 113 can store the current power cycle count at the time of initializing the block family. As blocks associated with the memory device are programmed, the block family manager component 113 associates the block with the block family. The block family manager component 113 can close the block family upon detecting an increment in the power cycle count, i.e., indicating that the memory sub-system has been powered off and back on again, or upon determining that the time that has elapsed since initializing the block family has exceeded a threshold time period. To continue the example above, even though the blocks programmed at 2:44 just before the memory sub-system is powered off, and the blocks programmed at 7:51 just after the memory sub-system is powered on, may have been programmed within the specified threshold time period based on the cumulative power-on clock, the block family manager component 113 can group the blocks in different block families based on the differing power cycle count.

In some embodiments, the block family manager component 113 can identify blocks associated with the memory device (e.g., memory device 140) that share a power cycle count and that were programmed within the threshold time interval. The block family manager component 113 can scan a subset of the identified blocks. Note that in some implementations, the subset can include a single identified block, all the blocks identified, or any number in between. The subset can be a random selection of the identified blocks, or can be certain blocks within the identified blocks (e.g., can include the least recently programmed block, the most recently programmed blocks, and/or the block programmed in the middle of the threshold time interval). The subset can be selected in a manner not described here.

Based on the scan of the subset of identified blocks, the block family manager component 113 can determine with which threshold voltage offset bin to associate the identified blocks. In implementations, the scan can measure a data state metric (e.g., a voltage shift or a bit error rate) of the subset of the identified blocks. Based on the data state metric, the block family manager component 113 can associate the identified blocks with the appropriate threshold voltage offset bin. That is, the block family manager component 113 can associated the identified with the appropriate threshold voltage offset bin to offset the measured voltage shift or to correct the measured bit error rate.

Further details with regards to the operations of the block family manager component 113 are described below.

FIG. 2 schematically illustrates the temporal voltage shift caused by the slow charge loss exhibited by triple-level memory cells, in accordance with some embodiments of the present disclosure. While the illustrative example of FIG. 2 utilizes triple-level cells, the same observations can be made and, accordingly, the same remedial measures are applicable to single level cells and multi-level cells, as well as any other fractional or whole number of bits per cell (e.g., 3.5 bits per cell, etc.), in order to compensate for the slow charge loss.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrate program voltage distributions 220A-220N (also referred to as "program distributions" or "voltage distributions" or "distributions" or "levels" herein) of memory cells programmed by a respective write level (which can be assumed to be at the midpoint of the program distribution) to encode a corresponding logical level ("000" through "111" in case of a TLC). The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The read threshold voltage levels are labeled Va-Vh. As shown, any measured voltage below Va is associated with the ER state. The states labeled P1, P2, P3, P4, P5, P6, and P7 correspond to distributions 220A-220N, respectively.

Time After Program (TAP) herein shall refer to the time since a cell has been written and is the primary driver of TVS (temporal voltage shift) along with temperature. TVS captures SCL as well as other charge loss mechanisms. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from X to Y minutes or hours after program). A time slice can be referenced by its center point.

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages needs to be adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
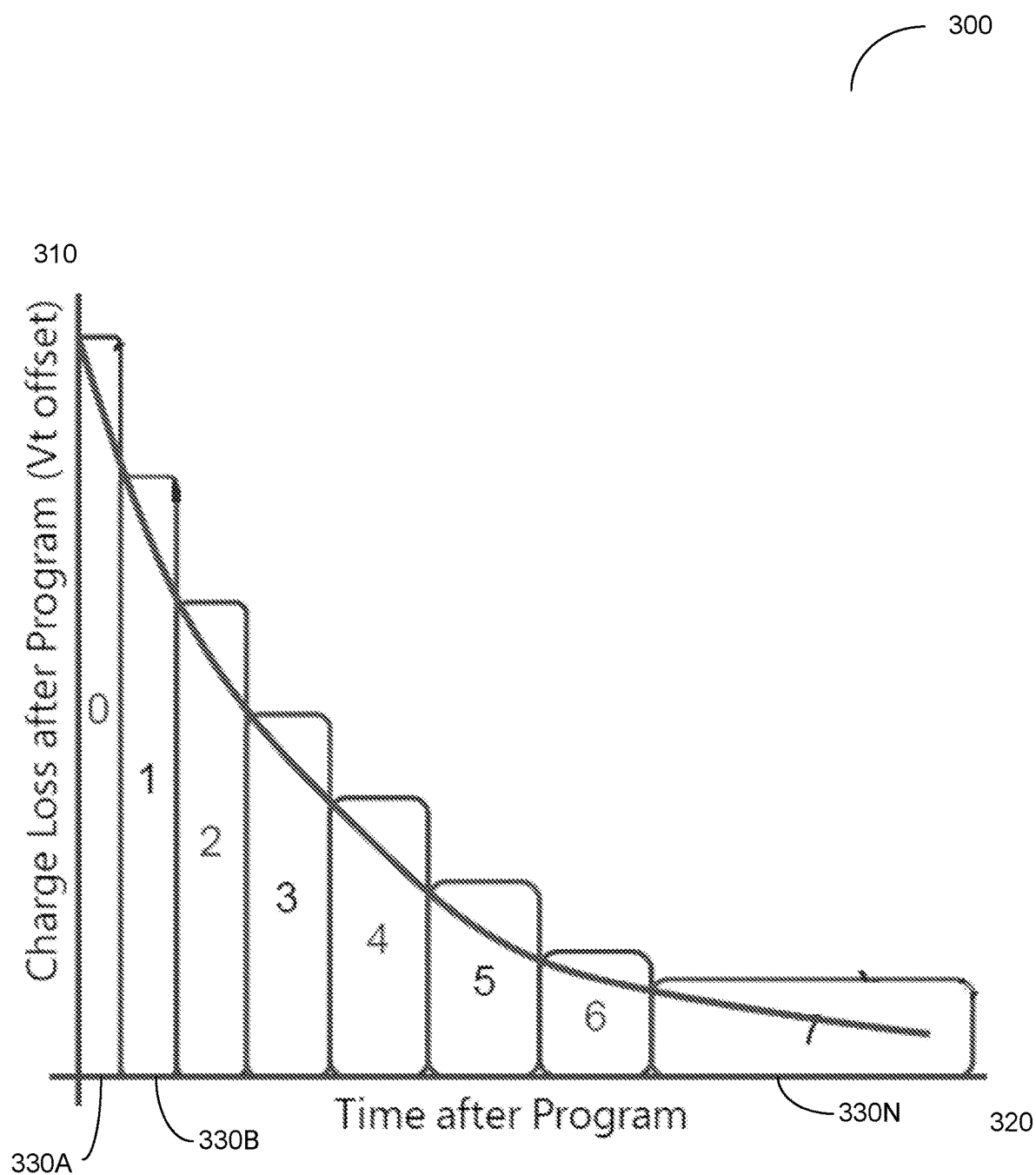
FIG. 3 depicts an example graph illustrating the dependency of the threshold voltage offset on the time after program (i.e., the period of time elapsed since the block had been programmed), in accordance with embodiments of the present disclosure FIG. 4 schematically illustrates a set of predefined threshold voltage offset bins, in accordance with embodiments of the present disclosure.

FIG. 3 depicts an example graph 300 illustrating the dependency of the threshold voltage offset 310 on the time after program 320 (i.e., the period of time elapsed since the block had been programmed), in accordance with embodiments of the present disclosure. As schematically illustrated by FIG. 3, block families of the memory device are grouped into threshold voltage offset bins 330A-330N, such that each block family includes one or more blocks that have been programmed within a specified time window, a specified temperature window, and during the same power cycle. As noted herein above, since the time elapsed after programming and temperature are the main factors affecting the temporal voltage shifts, all blocks and/or partitions within a block family are presumed to exhibit similar distributions of threshold voltages in memory cells, and thus would require the same voltage offsets to be applied to the base read levels for read operations.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family, whenever the power cycle count increases, or whenever the reference temperature of memory cells, which is updated at specified time intervals, has changed by more than a specified threshold value since creation of the current block family.

A newly created block family can be associated with bin 0. Then, the memory sub-system controller can periodically perform a foreground or background calibration process in order to associate each die of every block family with one of the predefined threshold voltage offset bins (bins 0-7 in the illustrative example of FIG. 3), which is in turn associated with the voltage offsets to be applied for read operations. The associations of blocks with block families and block families and dies with threshold voltage offset bins can be stored in respective metadata tables maintained by the memory sub-system controller.

Figure 4:
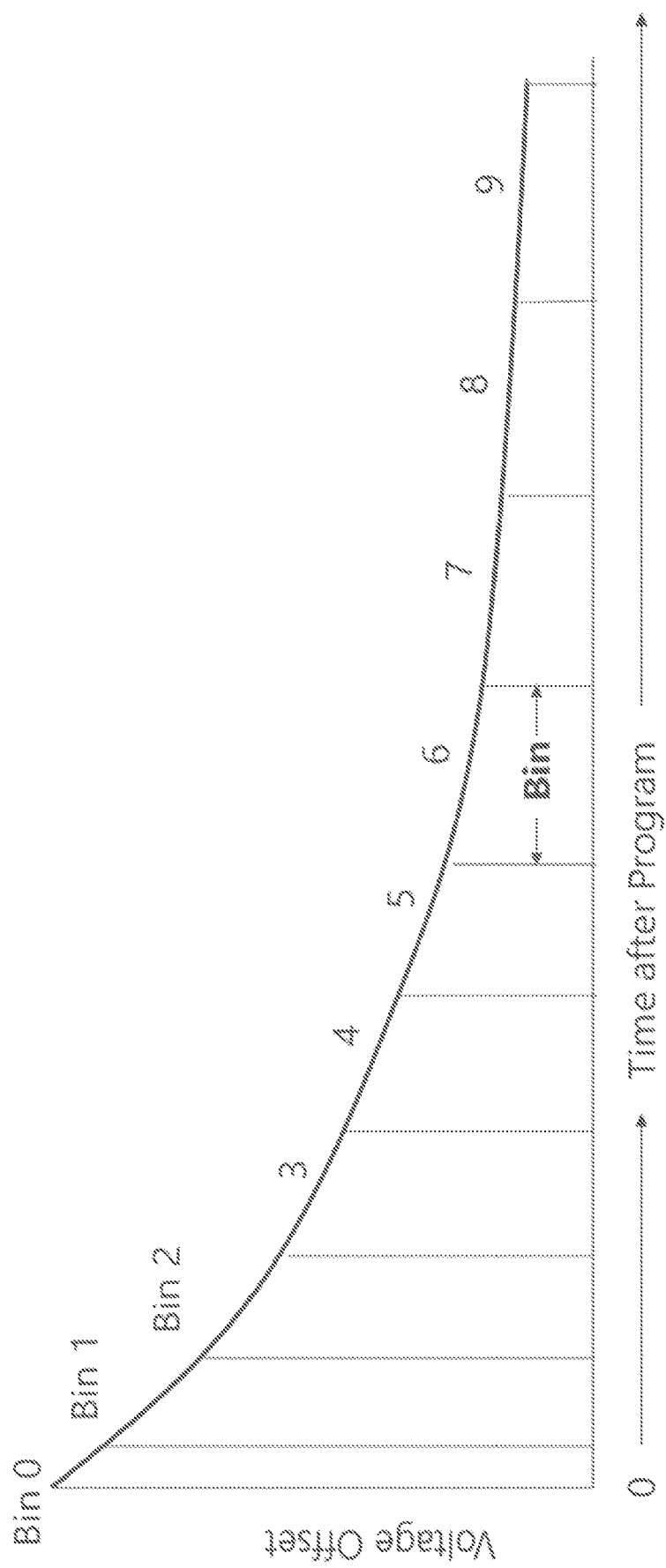

FIG. 4 schematically illustrates a set of placed threshold voltage offset bins (bin 0 to bin 9), in accordance with embodiments of the present disclosure. As schematically illustrated by FIG. 4, the threshold voltage offset graph can be subdivided into multiple bins, such that each bin corresponds to a range of threshold voltage offsets. While the illustrative example of FIG. 4 defines ten bins, in other implementations, various other numbers of bins can be employed (e.g., 64 bins).

The memory sub-system controller can associate each die of every block family with a threshold voltage offset bin, based on a periodically performed calibration process. The calibration process selects a set of threshold voltage offsets to be applied to the base voltage read level in order to perform read operations. The calibration process involves performing, with respect to a specified number of randomly selected pages or blocks within the block family that is being calibrated, read operations utilizing different threshold voltage offsets, and choosing the threshold voltage offset that minimizes the error rate (e.g., a bit error rate) of the read operation. Additionally or alternatively, to compensate for SCL, the calibration process can make measurements about a data state metric, such as voltage shift for a particular valley, to assign a block family to a bin which has corresponding offsets.

Figure 5:
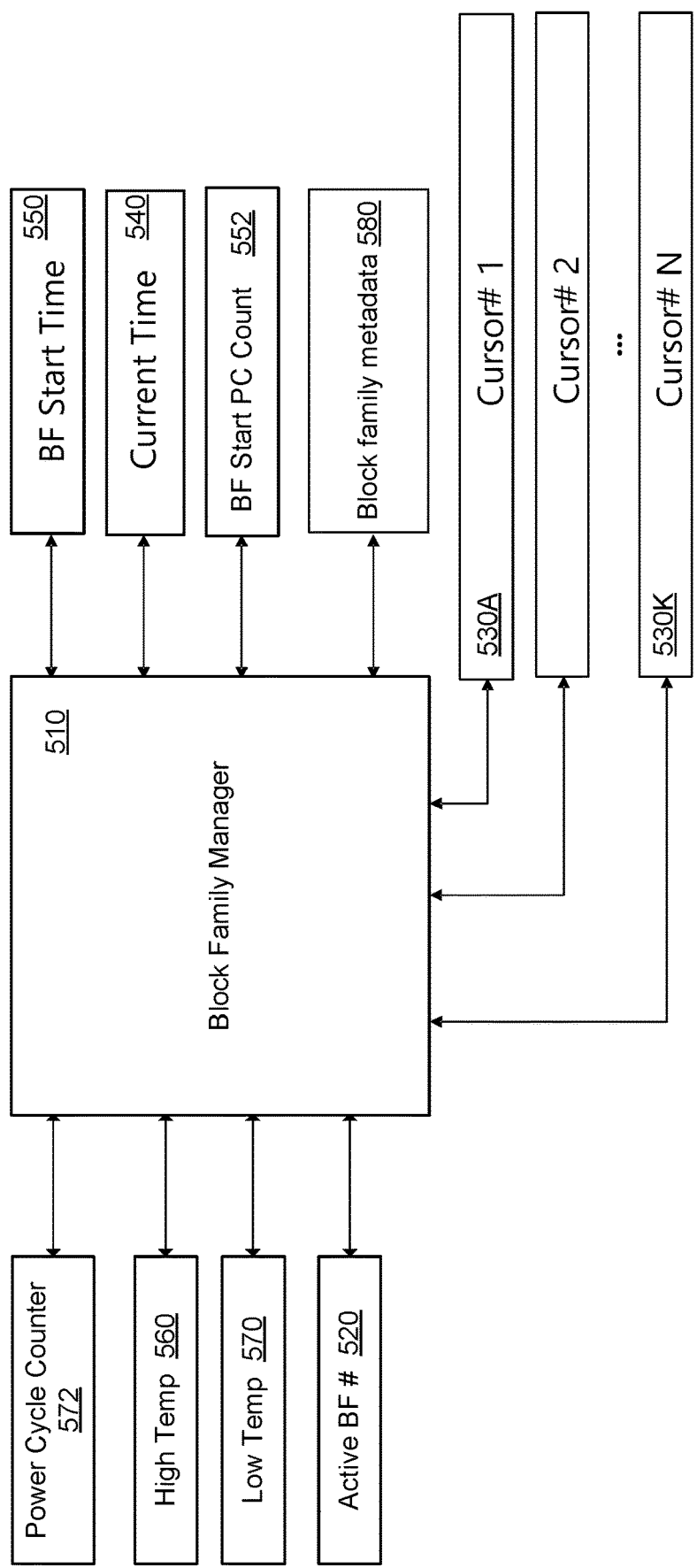
FIG. 5 schematically illustrates block family management operations implemented by the block family manager component of the memory-sub-system controller operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state. Generally, neither the POM clock nor the less accurate clock continue running when the controller is powered off.

The memory sub-system controller can utilize a power cycle counter 572 for tracking the power cycles of the memory sub-system. The power cycle counter 572 can maintain a count that represents the number of times the memory sub-system has been powered on; that is, the power cycle counter 572 is incremented upon detecting a power on event.

Upon initialization of each block family, the current time 540 and the power cycle count 572 are stored in a memory variable as the block family start time 550 and the block family start power cycle (PC) count 552. As the pages or blocks are programmed, the current time 540 is compared to the block family start time 550, and the power cycle counter 572 is compared to the block family start power cycle count

552. Responsive to detecting that the difference of the current time 540 and the block family start time 550 is greater than or equal to the specified time period (e.g., a predetermined number of minutes), and/or responsive to detecting that the difference between the power cycle counter 572 and the block family start power cycle count 552 do not match, the memory variable storing the active block family identifier 520 is updated to store the next block family number (e.g., the next sequential integer number), the memory variable storing the block family start time 550 is updated to store the current time 540, and the memory variable storing the block family start power cycle count 552 is updated to store power cycle counter 572.

The block family manager 510 can also maintain two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can close the existing block family and can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, the memory sub-system controller associates the block with the currently active block family. The association of each block with a corresponding block family is reflected by the block family metadata 580, as described in more detail herein below with reference to FIG. 7.

As noted herein above, based on a periodically performed calibration scan (i.e., calibration process), the memory sub-system controller associates each die of every block family with a threshold voltage offset bin, which defines a set of threshold voltage offsets to be applied to the base voltage read level in order to perform read operations. In some embodiments, the scan is performed in response to detecting a power on event. The scan can involve performing, with respect to a subset of identified plurality of blocks, read operations utilizing different threshold voltage offsets, and choosing the threshold voltage offset bin that results in a defined error rate of the read operation. The identified plurality of blocks can include blocks that share a common power cycle interval and a common programming time interval. The subset of the identified blocks can be randomly selected, or selected based on satisfying a specific criterion (such as being the least recently programmed block(s) in the identified plurality of blocks).

Figure 6:
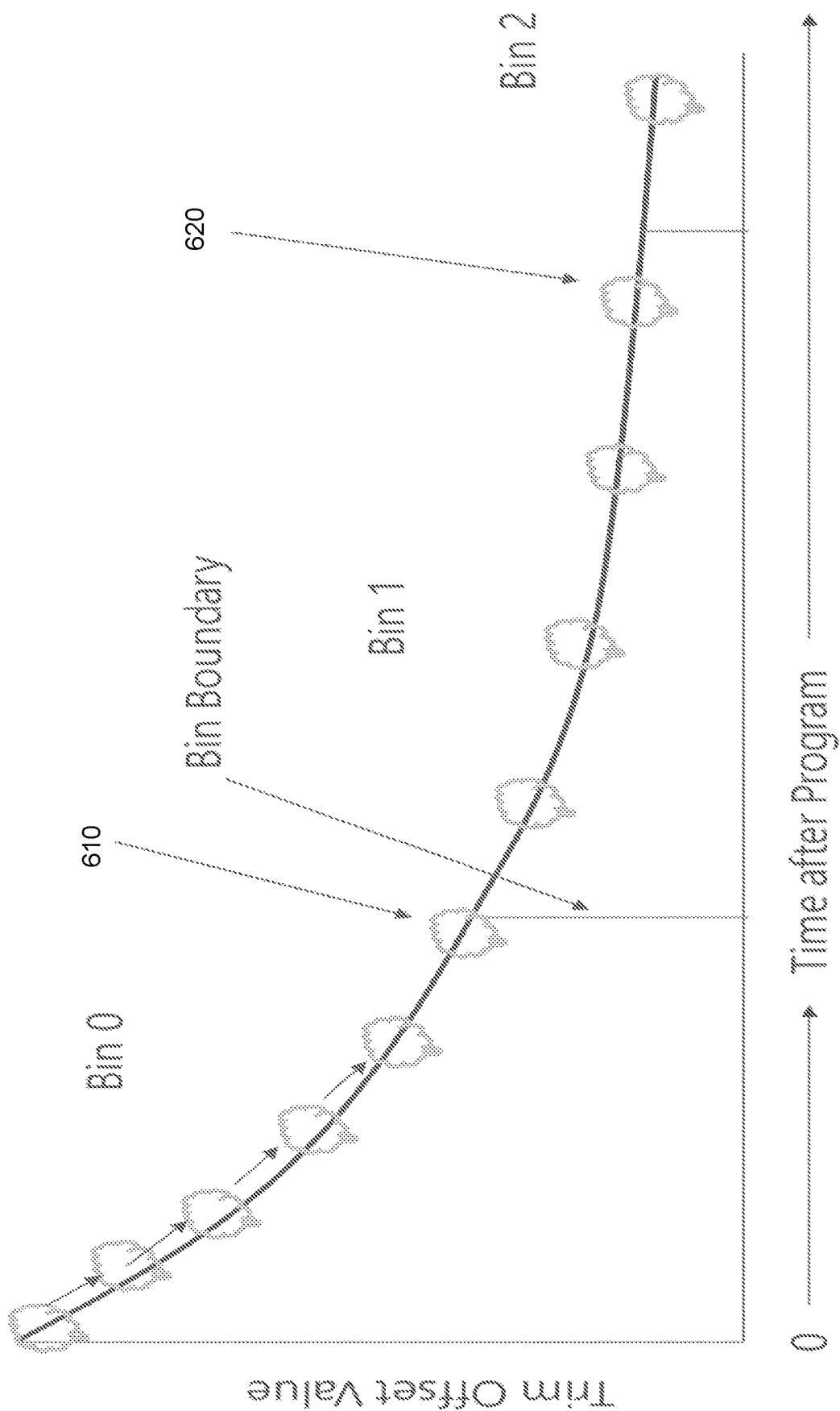
FIG. 6 schematically illustrates selecting block families for calibration, in accordance with embodiments of the present disclosure.

FIG. 6 schematically illustrates selecting block families for calibration, in accordance with embodiments of the present disclosure. As schematically illustrated by FIG. 6, the memory sub-system controller can limit the calibration operations to the oldest block family in each threshold voltage offset bin (e.g., block family 610 in bin 0 and block family 620 in bin 1), since it is the oldest block family that will, due to the slow charge loss, migrate to the next threshold voltage offset bin before any other block family of the current threshold voltage offset bin.

Figure 7:
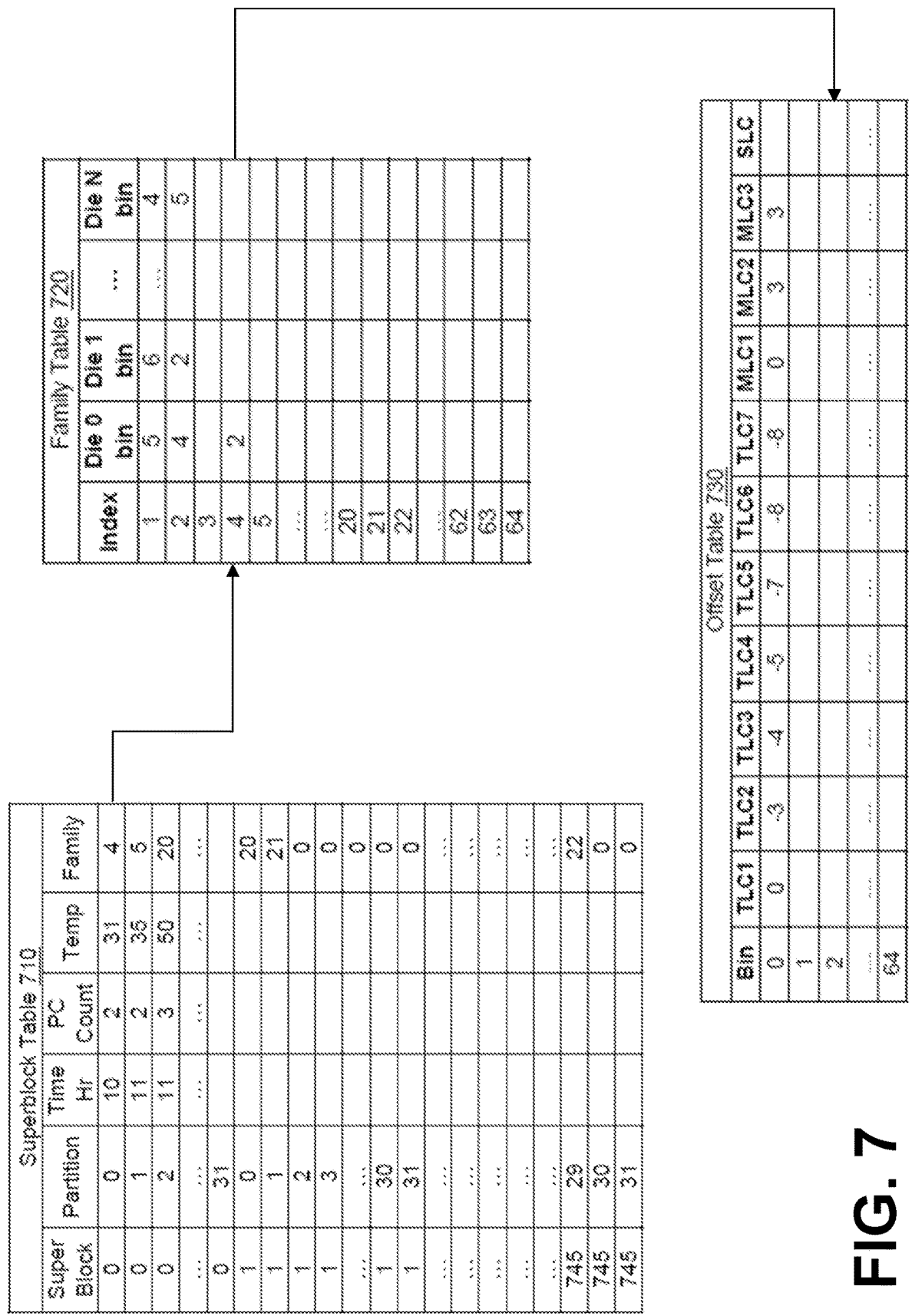
FIG. 7 schematically illustrates example metadata maintained by the memory sub-system controller for associating blocks and/or partitions with block families, in accordance with embodiments of the present disclosure.

FIG. 7 schematically illustrates example metadata maintained by the memory sub-system controller for associating blocks and/or partitions with block families, in accordance with embodiments of the present disclosure. As schematically illustrated by FIG. 7, the memory sub-system controller can maintain the superblock table 710, the family table 720, and the offset table 730.

Each record of the superblock table 710 specifies the block family associated with the specified superblock and partition combination. In some implementations, the superblock table records can further include time, power cycle count, and temperature values associated with the specified superblock and partition combination.

The family table 720 is indexed by the block family number, such that each record of the family table 720 specifies, for the block family referenced by the index of the record, a set of threshold voltage offset bins associated with respective dies of the block family. In other words, each record of the family table 720 includes a vector, each element of which specifies the threshold voltage offset bin associated with the die referenced by the index of the vector element. The threshold voltage offset bins to be associated with the block family dies can be determined by the calibration process, as described in more detail herein above.

Finally, the offset table 730 is indexed by the threshold voltage offset bin number. Each record of the offset table 730 specifies a set of threshold voltage offsets (e.g., for TLC, MLC, and/or SLC) associated with the threshold voltage offset bin.

The metadata tables 710-730 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 710 is used to identify the block family identifier corresponding to the physical block number; then, the block family identifier is used as the index to the family table 720 in order to determine the threshold voltage offset bin associated with the block family and the die; finally, the identified threshold voltage offset bin is used as the index to the offset table 730 in order to determine the threshold voltage offset corresponding to the threshold voltage offset bin. The memory sub-system controller can then additively apply the identified threshold voltage offset to the base voltage read level in order to perform the requested read operation.

In the illustrative example of FIG. 7, the superblock table 710 maps partition 0 of the superblock 0 to block family 4, which is utilized as the index to the family table 720 in order to determine that die 0 is mapped to bin 2. The latter value is used as the index to the offset table in order to determine the threshold voltage offset values for bin 2.

Figure 8:
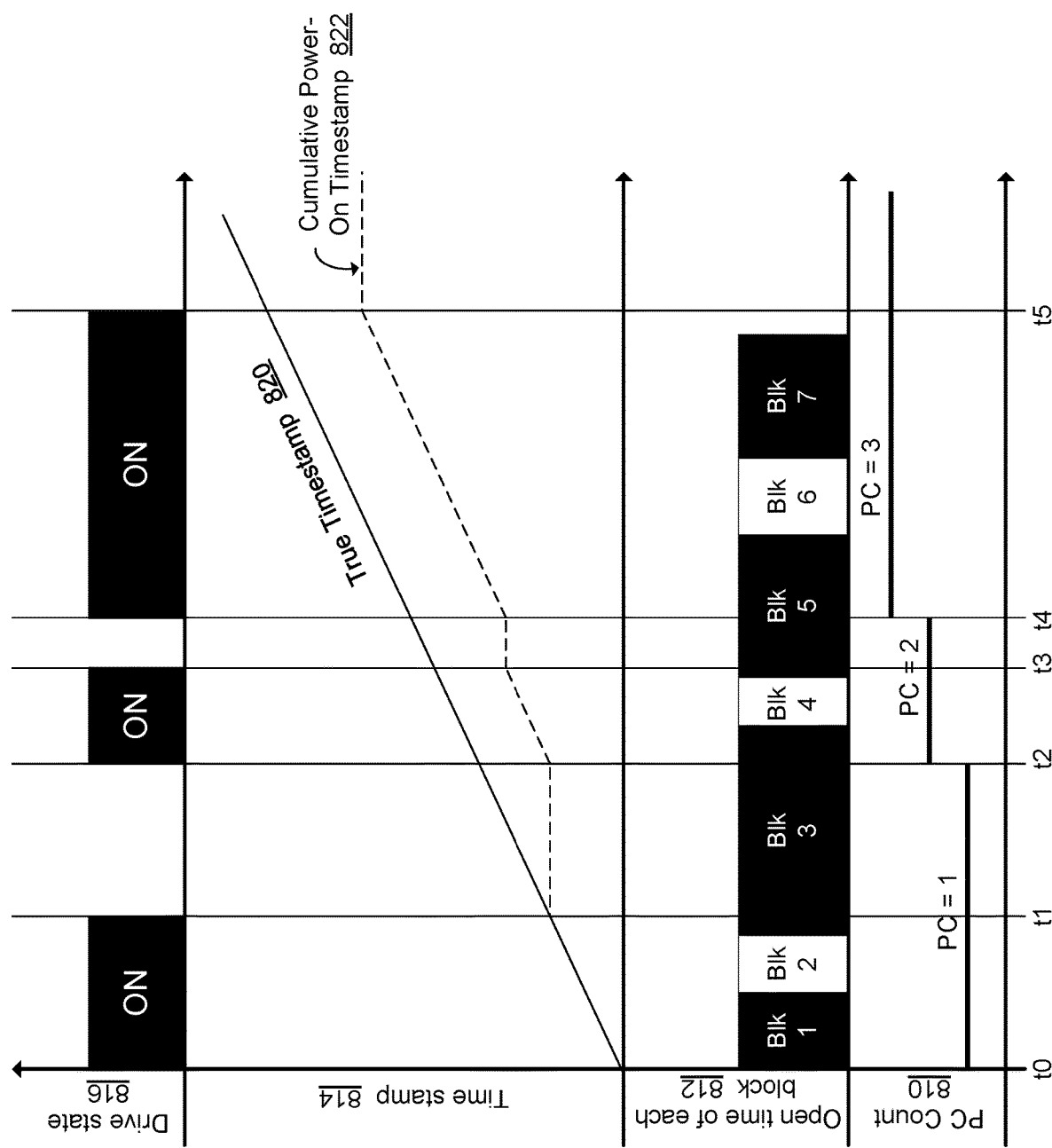
FIG. 8 schematically illustrates grouping blocks based on both the power cycle count and the cumulative power-on time, in accordance with embodiments of the present disclosure.

FIG. 8 schematically illustrates an example of grouping blocks based on a combination of the power cycle count and the cumulative power-on time of the memory sub-system, in accordance with some embodiments of the present disclosure. As illustrated in FIG. 8, blocks 1 and 2 are opened and closed during power cycle (PC) 1. Block 2 is opened during power cycle 1 and closed curing power cycle 2. Block 4 is opened and closed during power cycle 2. Block 5 is opened curing power cycle 2 and closed during power cycle 3. Block 6 is opened and closed during power cycle 3.

The power cycle count 810 is incremented each time drive state is powered on. As illustrated in FIG. 8, the drive state is "On" at time t0 and is powered off at time t1. At time t2 the drive state is "On," and the power cycle count 810 is incremented. The drive is powered off at time t3. At time t4 the drive is powered on, and the power cycle count 810 is incremented.

Also illustrated in FIG. 8 is the progression of a true timestamp 820 compared with the cumulative power-on timestamp 822. The true timestamp 820 can represent the true progression of time. The cumulative power-on timestamp 822 can represent the power on minutes (POM) clock as maintained by the memory sub-system controller. The cumulative power-on timestamp 822 does not keep track of the time that the drive state is not "On."

In embodiments, the memory sub-system controller can group the blocks based on both the cumulative power-on timestamp 822 and the power cycle count 810. For example, the memory sub-system controller can determine that blocks 1 and 2 were opened and closed within the specified time period window, and can determine that blocks 1 and 2 were opened and closed during the same power cycle (i.e., power cycle count 1). Hence, the memory sub-system controller can group blocks 1 and 2 in the same block family.

The memory sub-system controller can determine that, according to the cumulative power-on timestamp 822, blocks 3 and 4 were opened and closed within the specified time period window. However, blocks 3 and 4 were opened and closed in different power cycles (i.e., block 3 was opened in power cycle count 1 and closed in power cycle count 2, and block 4 was opened and closed in power cycle count 2). As such, the memory sub-system controller can determine not to group blocks 3 and 4 in the same block family.

The memory sub-system controller can determine that blocks 6 and 7 were opened and closed in the same power cycle (i.e., power cycle count 3). However, the memory sub-system controller can determine that blocks 6 and 7 were not opened and closed within the specified time period window. That is, the difference between the cumulative power-on timestamp 822 at the time block 7 was closed and the cumulative power-on timestamp 822 at the time block 6 was opened exceeds the threshold period. Hence, the memory sub-system controller can determine not to group blocks 6 and 7 in the same block family.

Figure 9:
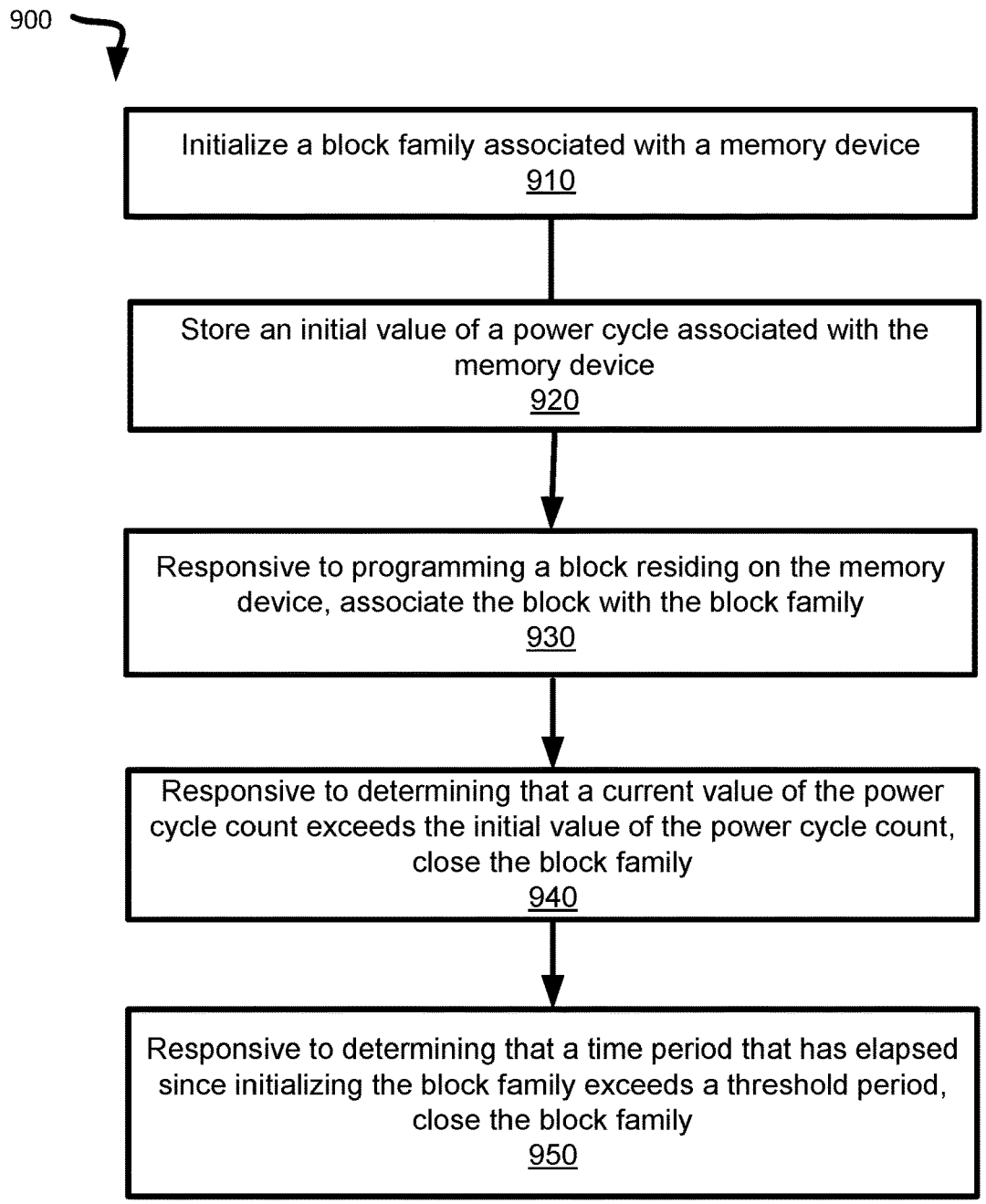
FIG. 9 is a flow diagram of an example method to group blocks based on power cycle count and cumulative power-on time, in accordance with some embodiments of the present disclosure.

FIG. 9 is a flow diagram of an example method to group blocks based on power cycle count and cumulative power on time, in accordance with embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the processing logic initializes a block family associated with a memory device. The processing logic can further associate the block family with a threshold voltage offset bin, as described in more detail herein below with reference to FIG. 7.

At operation 920, the processing logic stores an initial value of a power cycle associated with the memory device. In embodiments, the power cycle value can be stored in non-volatile memory associated with the memory device. The power cycle value can be incremented responsive to detecting a powering on of the memory device, and thus can keep track of the number of times the memory device has been powered on.

At operation 930, responsive to programming a block residing on the memory device, the processing logic associates the block with the block family. In embodiments, the processing logic associates the block with the block family by updating block family metadata associated with the memory device. The block family metadata includes a table including a plurality of records, and each record associates a block with a block family.

At operation 940, responsive to determining that a current value of the power cycle count exceeds the initial value of the power cycle count, the processing logic closes the block family. In embodiments, the processing logic can allow for a counter reset. That is, once the counter has reached its maximum value, the counter can reset and the processing logic can accurately identify that the current value of the power cycle exceeds the initial value of the power cycle count.

At operation 950, responsive to determining that a time period that has elapsed since initializing the block family exceeds a threshold period, the processing logic closes the block family. The time period that has elapsed since initializing the block family can be based on a cumulative power-on clock associated with the memory device. Responsive to closing the block family, the processing logic initializes a new block family.

In embodiments, the processing logic can initialize a low temperature and a high temperature based on a reference temperature of the memory device. Then, responsive to determining that the difference between the high temperature and the low temperature is greater than or equal to a specified threshold temperature value, the processing logic closes the block family.

In embodiments, the processing logic can receive a second reference temperature of the memory device. Responsive to determining that the second reference temperature is greater than or equal to the high temperature, the processing logic can update the high temperature to store the second reference temperature. Alternatively, responsive to determining that the second reference temperature falls below the low temperature, the processing logic can update the low temperature to store the second reference temperature.

FIG. 10 is a flow diagram to associate block families with a particular threshold voltage offset bin based on a calibration scan, in accordance with embodiments of the present disclosure. Block families are block/blocks grouped based on power cycle and cumulative power-on time, in accordance with embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. In embodiments, the operations of FIG. 10 can be performed responsive to detecting a power-on event of the memory sub-system.

At operation 1010, the processing logic identifies a plurality of blocks of a memory device that share a common power cycle interval, a common programming time interval, and a common programming temperature range. The processing logic can inspect the programmed blocks associated with the memory device and identify the blocks that were programmed within a specified time interval (e.g., within a certain predetermined number of minutes), that were programmed in the same power cycle, and that were programmed within specified temperature range. The time interval is specified by a first timestamp value reflecting a time when the block was opened based on a cumulative power-on clock, and a second timestamp value reflecting a time when the block was closed based on the cumulative power-on clock. The temperature range is determined by a low temperature and a high temperature based on a reference temperature of the memory device. The power cycle interval is specified by a first power cycle count representing the power cycle count when the block was opened, and a second power cycle count representing the power cycle count when the block was closed.

At operation 1020, the processing logic performs a scan operation with respect to a subset of the plurality of blocks. The subset can be selected at random, or can include a predetermined block (e.g., the least recently programmed block within the plurality of blocks). The subset can include a single block, more than one block, or all the identified blocks. The scan operation can include measuring a data state metric of the memory cells in the subset of the plurality of blocks. The data state metric can be, for example, the voltage shift or a bit error rate. The processing logic can identify the threshold voltage offset bin corresponding to the measured data state metric value. That is, the processing logic can identify the threshold voltage offset bin to offset the measured voltage shift or to correct the measured bit error rate.

At operation 1030, the processing logic can associate, based on the scan operation, the plurality of blocks with a threshold voltage offset bin. At operation 1040, the processing logic updates block family metadata associated with the memory device. The block family metadata includes a table of records, and each record associates each subset of blocks with a corresponding threshold voltage offset bin. Block family metadata is further described with respect to FIG. 7.

Figure 11:
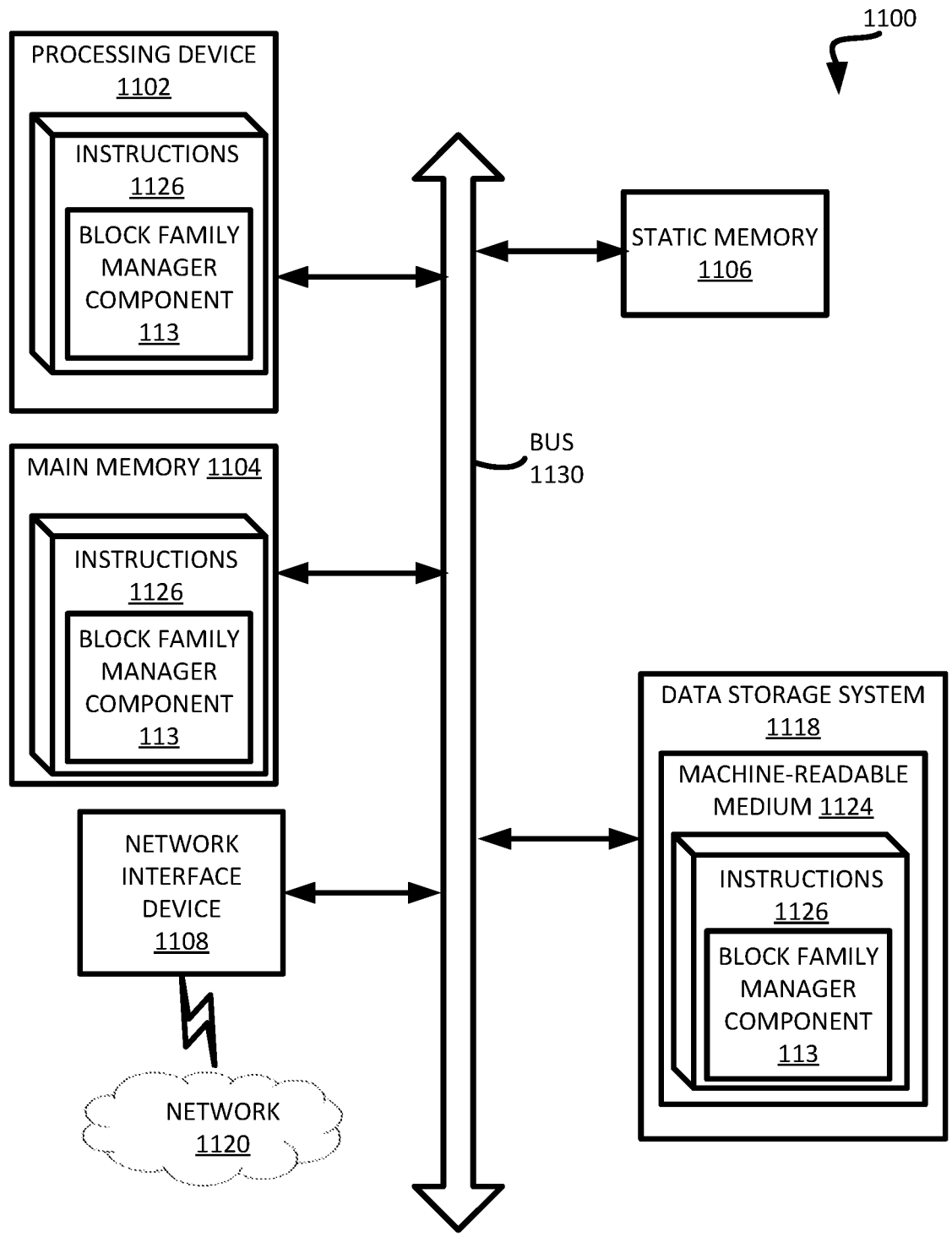
FIG. 11 is a block diagram of an example computer system in which embodiments of the present disclosure may operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or RDRAM, etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to a block family manager component (e.g., the block family manager component 113 of FIG. 1). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processor, operatively coupled to the memory device, the processor to perform operations comprising:
identifying an initial value of a power cycle count associated with the memory device, wherein the power cycle count is incremented responsive to detecting a powering up of the memory device;
responsive to programming a block residing on the memory device, associating the block with a current block family associated with the memory device;
determining a current value of the power cycle count; and
responsive to determining that a difference between the initial value of the power cycle count and the current value of the power cycle count satisfies a predefined condition, closing the current block family.

2. The system of claim 1, wherein associating the block with the current block family further comprises:
updating block family metadata associated with the memory device, wherein the block family metadata comprises a table including a plurality of records, and wherein a record of the plurality of records associates the block with the current block family.

3. The system of claim 1, further comprising:
initializing the current block family associated with the memory device; and
responsive to initializing the current block family, associating the current block family with a threshold voltage offset bin.

4. The system of claim 1, further comprising:
responsive to closing the current block family, initializing a new block family.

5. The system of claim 1, further comprising:
initializing a low temperature and a high temperature based on a reference temperature of the memory device; and
responsive to determining that a difference between the high temperature and the low temperature is greater than or equal to a specified threshold temperature value, closing the current block family.

6. The system of claim 5, further comprising:
receiving a second reference temperature of the memory device;
responsive to determining that the second reference temperature is greater than or equal to the high temperature, updating the high temperature to store the second reference temperature; and
responsive to determining that the second reference temperature falls below the low temperature, updating the low temperature to store the second reference temperature.

7. The system of claim 1, wherein the initial value of the power cycle count associated with the memory device is stored in non-volatile memory associated with the memory device.

8. A method comprising:
identifying an initial value of a power cycle count associated with a memory device, wherein the power cycle count is incremented responsive to detecting a powering up of the memory device;
responsive to programming a block residing on the memory device, associating the block with a current block family associated with the memory device;
determining a current value of the power cycle count; and
responsive to determining that a difference between the initial value of the power cycle count and the current value of the power cycle count satisfies a predefined condition, closing the current block family.

9. The method of claim 8, wherein associating the block with the current block family further comprises:
updating block family metadata associated with the memory device, wherein the block family metadata comprises a table including a plurality of records, and wherein a record of the plurality of records associates the block with the current block family.

10. The method of claim 8, further comprising:
initializing the current block family associated with the memory device; and
responsive to initializing the current block family, associating the current block family with a threshold voltage offset bin.

11. The method of claim 8, further comprising:
responsive to closing the current block family, initializing a new block family.

12. The method of claim 8, further comprising:
initializing a low temperature and a high temperature based on a reference temperature of the memory device; and
responsive to determining that a difference between the high temperature and the low temperature is greater than or equal to a specified threshold temperature value, closing the current block family.

13. The method of claim 12, further comprising:
receiving a second reference temperature of the memory device;
responsive to determining that the second reference temperature is greater than or equal to the high temperature, updating the high temperature to store the second reference temperature; and
responsive to determining that the second reference temperature falls below the low temperature, updating the low temperature to store the second reference temperature.

14. A non-transitory computer-readable storage medium comprising instructions that, when executed by a processing device, cause the processing device to perform operations comprising:
identifying an initial value of a power cycle count associated with a memory device, wherein the power cycle count is incremented responsive to detecting a powering up of the memory device;
responsive to programming a block residing on the memory device, associating the block with a current block family associated with the memory device;
determining a current value of the power cycle count; and
responsive to determining that a difference between the initial value of the power cycle count and the current value of the power cycle count satisfies a predefined condition, closing the current block family.

15. The non-transitory computer-readable storage medium of claim 14, wherein associating the block with the current block family further comprises:
updating block family metadata associated with the memory device, wherein the block family metadata comprises a table including a plurality of records, and wherein a record of the plurality of records associates the block with the current block family.

16. The non-transitory computer-readable storage medium of claim 14, further comprising:
initializing the current block family associated with the memory device; and
responsive to initializing the current block family, associating the current block family with a threshold voltage offset bin.

17. The non-transitory computer-readable storage medium of claim 14, further comprising:
responsive to closing the current block family, initializing a new block family.

18. The non-transitory computer-readable storage medium of claim 14, further comprising:
initializing a low temperature and a high temperature based on a reference temperature of the memory device; and
responsive to determining that a difference between the high temperature and the low temperature is greater than or equal to a specified threshold temperature value, closing the current block family.

19. The non-transitory computer-readable storage medium of claim 18, further comprising:
receiving a second reference temperature of the memory device;
responsive to determining that the second reference temperature is greater than or equal to the high temperature, updating the high temperature to store the second reference temperature; and
responsive to determining that the second reference temperature falls below the low temperature, updating the low temperature to store the second reference temperature.

20. The non-transitory computer-readable storage medium of claim 14, wherein the initial value of the power cycle count associated with the memory device is stored in non-volatile memory associated with the memory device.

* * * * *